(12) United States Patent
Gingrich, III et al.

(10) Patent No.: US 10,026,568 B2
(45) Date of Patent: Jul. 17, 2018

(54) ELECTRONIC DEVICE WITH SWITCH MECHANISM MOUNTED TO SUBSTRATE

(71) Applicant: Tyco Electronics Corporation, Berwyn, PA (US)

(72) Inventors: Charles Raymond Gingrich, III, Mechanicsburg, PA (US); Matthew Edward Mostoller, Hummelstown, PA (US); Ronald Martin Weber, Annville, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 140 days.

(21) Appl. No.: 14/671,563

(22) Filed: Mar. 27, 2015

(65) Prior Publication Data
US 2016/0286650 A1    Sep. 29, 2016

(51) Int. Cl.
*H01H 9/02* (2006.01)
*H01H 1/58* (2006.01)
*H01H 13/70* (2006.01)
*H05K 1/18* (2006.01)

(52) U.S. Cl.
CPC .......... *H01H 9/02* (2013.01); *H01H 1/5805* (2013.01); *H01H 13/70* (2013.01); *H05K 1/184* (2013.01); *H01H 2207/02* (2013.01); *H01H 2223/054* (2013.01); *H01H 2223/058* (2013.01); *H05K 2201/10053* (2013.01); *H05K 2201/10446* (2013.01)

(58) Field of Classification Search
CPC .......... H05K 1/18; H05K 1/184; H01H 9/02; H01H 1/5805; H01H 13/70
USPC .......................................................... 200/293
See application file for complete search history.

(56) References Cited

U.S. PATENT DOCUMENTS

| 4,389,555 | A | * | 6/1983 | Guinan | H01H 9/04 200/293 |
| 5,245,147 | A | * | 9/1993 | Kobayashi | H01H 13/02 200/293 |
| 2008/0271980 | A1 | * | 11/2008 | Seo | H01H 13/83 200/293 |
| 2010/0032271 | A1 | * | 2/2010 | Maehara | H01H 1/5805 200/294 |

(Continued)

FOREIGN PATENT DOCUMENTS

| DE | 298 19 520 U1 | 1/1999 |
| JP | 2001 195946 A | 7/2001 |

(Continued)

OTHER PUBLICATIONS

International Search Report, Application No. PCT/US2016/020553, International Filing Date, Mar. 3, 2016.

*Primary Examiner* — Edwin A. Leon
*Assistant Examiner* — Iman Malakooti

(57) ABSTRACT

An electronic device includes a substrate having a top surface, a bottom surface and at least one opening therethrough. The substrate has a circuit. A switch mechanism is mounted to the substrate and is electrically connected to the circuit. The switch mechanism has an actuator configured to activate the switch mechanism. The switch mechanism has a housing holding the actuator and leads extending from the housing. The leads are electrically connected to the circuit. The switch mechanism is mounted to the substrate in the opening such that at least a portion of the housing is positioned below the top surface.

18 Claims, 4 Drawing Sheets

(56) References Cited

U.S. PATENT DOCUMENTS

| | | | |
|---|---|---|---|
| 2011/0136390 A1* | 6/2011 | Gingrich, III | F21S 2/005 |
| | | | 439/660 |
| 2011/0136394 A1* | 6/2011 | Mostoller | F21K 9/00 |
| | | | 439/701 |
| 2015/0083478 A1* | 3/2015 | Endo | H01R 12/707 |
| | | | 174/261 |

FOREIGN PATENT DOCUMENTS

| WO | 2012 025222 A1 | | 3/2012 | |
|---|---|---|---|---|
| WO | WO 2012/025222 | * | 3/2012 | H01H 1/58 |

* cited by examiner

ELECTRONIC DEVICE WITH SWITCH MECHANISM MOUNTED TO SUBSTRATE

BACKGROUND OF THE INVENTION

The subject matter herein relates generally to electronic devices with switch mechanisms mounted to circuit boards.

Circuit boards have many applications, including use in electronic devices for controlling operations of the electronic device. Some electronic devices use switch mechanisms for the controls of the electronic device. The switch mechanisms are mounted to the circuit board and are presented at a user input of the electronic device, where the switch mechanisms may be actuated by a user. For example, some electronic devices use tactile switches associated with a keypad, where buttons or keys of the keypad are pressed to activate/deactivate the switch mechanisms. Some applications prefer electronic devices having low profiles. However, the switch mechanisms are typically mounted to the top surface of the circuit board and the thicknesses of the switch mechanisms add to the overall profile of the electronic device.

A need remains for electronic devices having low profiles for use in some applications.

BRIEF DESCRIPTION OF THE INVENTION

In one embodiment, a switch mechanism is provided that is configured to be mounted to a substrate having a top surface, a bottom surface and at least one opening therethrough and having a circuit. The switch mechanism includes an actuator configured to activate the switch mechanism and a housing holding the actuator. The housing has a top and a bottom and sides extending between the top and the bottom. The actuator being actuated from above the top of the housing. The switch mechanism includes leads extending from the housing having mounting pads being configured to be electrically connected to the circuit. The leads extend from the housing such that the mounting pads are elevated above the bottom of the housing to allow at least a portion of the housing to be positioned below the top surface of the substrate.

In a further embodiment, an electronic device is provided including a substrate having a top surface, a bottom surface and at least one opening therethrough. The substrate has a circuit. A switch mechanism is mounted to the substrate and is electrically connected to the circuit. The switch mechanism has an actuator configured to activate the switch mechanism. The switch mechanism has a housing holding the actuator and leads extending from the housing. The leads are electrically connected to the circuit. The switch mechanism is mounted to the substrate in the opening such that at least a portion of the housing is positioned below the top surface.

In another embodiment, an electronic device is provided including a substrate having a top surface, a bottom surface and at least one opening therethrough with a circuit. A switch mechanism is mounted to the substrate and is electrically connected to the circuit. The switch mechanism has an actuator configured to activate the switch mechanism. The switch mechanism has a housing holding the actuator and leads extending from the housing. The leads are electrically connected to the circuit. The switch mechanism is mounted to the substrate in the opening such that the actuator is positioned below the top surface of the substrate.

In a further embodiment, an electronic device is provided including a substrate having a top surface, a bottom surface and an edge extending between the top surface and the bottom surface to define a thickness profile of the substrate. The substrate has at least one opening therethrough at the edge. The substrate has a circuit. A switch mechanism is received in the opening at the edge and is electrically connected to the circuit. The switch mechanism has an actuator configured to activate the switch mechanism. The switch mechanism has a housing holding the actuator and leads extending from the housing. The leads are electrically connected to the circuit. The switch mechanism is mounted to the substrate in the opening such that the actuator is arranged within the thickness profile of the substrate and extends outward beyond the edge.

DETAILED DESCRIPTION OF THE INVENTION

Figure 1:
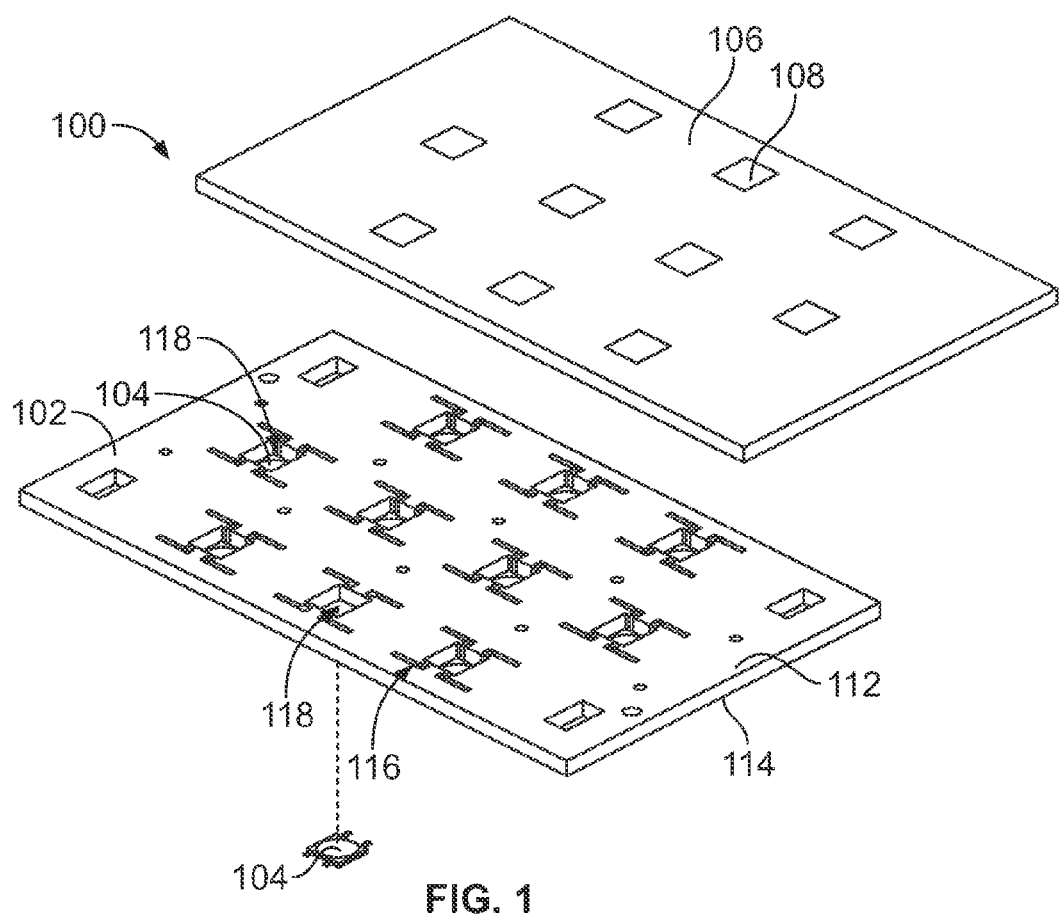
FIG. 1 is an exploded perspective view of an electronic device formed in accordance with one embodiment.

FIG. 1 is an exploded perspective view of an electronic device 100 formed in accordance with one embodiment. The electronic device 100 includes a substrate 102 to which electrical components are connected (e.g., an assembly containing conductive elements), such as, but not limited to, a circuit board, which may be a 2D or 3D included circuit board, a rigid circuit board or a flexible circuit board. Other types of substrates include a molded interconnect device, or other types of devices. While the embodiments illustrated herein are in reference to a circuit board and referred to hereinafter as circuit board 102, the subject matter herein is not intended to be limited to circuit boards. The electronic device 100 includes one or more switch mechanisms 104, or simply switch(s) 104, mechanically and electrically coupled to the circuit board 102.

The electronic device 100 includes a user input 106 (shown poised for mounting to the circuit board 102) having one or more user input actuators 108 used to actuate the one or more switches 104. The user input 106 is positioned above the circuit board 102 and receives inputs from a user to control operation of the electronic device 100. The user input 106 may be a plastic, silicone or other array of one or more mechanical actuator features. The user input 106 may be a keypad and the user input actuators 108 may be keys that may be pressed by a user to control the electronic device 100. Other types of user inputs may be provided and the user inputs may have other types of user input actuators 108. For example, rather than push buttons or keys, the user input 106 may have toggle buttons, rocker buttons, rotating buttons, slide buttons, molded domes, and the like used to adjust or actuate corresponding switches 104.

The circuit board 102 includes a top surface 112 and a bottom surface 114 opposite the top surface 112. The top surface 112 faces the user input 106. Optionally, the top surface 112 may be upward facing and the bottom surface 114 may be downward facing; however other orientations are possible in alternative embodiments. The circuit board 102 includes one or more circuits 116 with switches 104 electrically connected to corresponding circuits 116. The circuits 116 may be printed circuits printed on one or more layers of the circuit board 102. The circuits 116 may include traces (such as on the top surface 112, the bottom surface 114 or other layers of the circuit board 102), pads (such as for mounting the switches 104 to the circuits 116), vias (such as for routing between layers of the circuit board 102), electrical components (such as resistors, transistors, capacitors, and the like), and the like.

The switch 104 is mechanically and electrically connected to the circuit board 102, such as to a corresponding circuit 116 of the circuit board 102. For example, the switch 104 may be soldered to the circuit board 102. The switch 104 may have a low profile, which may reduce the overall height or thickness of the electronic device 100. In an exemplary embodiment, the switch 104 is at least partially recessed relative to the top surface 112 of the circuit board 102. For example, at least a portion of the switch 104 may be received in an opening 118 in the circuit board 102. Optionally, substantially the entire switch 104 may be positioned below the top surface 112. Optionally, substantially the entire switch 104 may be positioned below the bottom surface 114.

Figure 2:
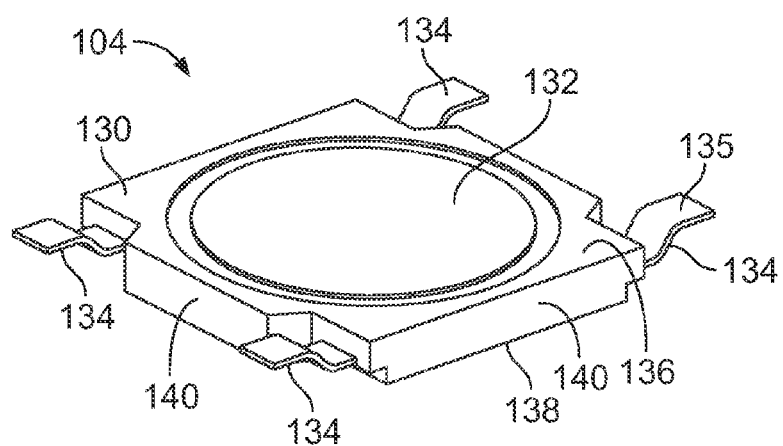
FIG. 2 is a perspective view of a switch mechanism of the electronic device formed in accordance with an exemplary embodiment.

FIG. 2 is a perspective view of the switch mechanism 104 formed in accordance with an exemplary embodiment. The switch 104 includes a housing 130 having an actuator 132 that may be actuated, such as by the corresponding user input actuator 108 (shown in FIG. 1). The switch 104 includes a plurality of leads 134 extending from the housing 130. The leads 134 are configured to be electrically connected to corresponding mounting pads and traces of the circuit 116 (shown in FIG. 1). In the illustrated embodiment, the leads 134 are conductive solder tails having corresponding mounting pads 135 for surface mounting and soldering to corresponding mounting pads of the circuit 116. However other types of leads may be used in alternative embodiments, such as spring beams, compliant pins, and the like.

In an exemplary embodiment, the housing 130 includes and/or is formed from a dielectric material, such as a plastic material. The housing 130 extends between a top 136 and a bottom 138. The actuator 132 is provided at the top 136 and is configured to face the user input actuator 108. The top 136 may be oriented generally parallel to the top surface 112 (shown in FIG. 1) of the circuit board 102 (shown in FIG. 1). The leads 134 extend from sides 140 of the housing 130. Optionally, the leads 134 may extend from the middle of the sides 140, such as approximately centered between the top 136 and the bottom 138; however the leads 134 may extend from the sides 140 near the top 136 or near the bottom 138. Alternatively, the leads 134 may extend from the top 136 and/or the bottom 138, as opposed to the sides 140, and may be bent outward. Various leads 134 may be electrically connected by the actuator 132 when the switch 104 is activated and/or deactivated.

The actuator 132 is provided at the top 136 and is configured to face the user input actuator 108. In the illustrated embodiment, the actuator 132 is a tactile button that is configured to be actuated by pressing in a pressing direction generally perpendicular to the top 136. The user input actuator 108 may press the actuator 132 to actuate the switch 104. Other types of actuators may be provided in alternative embodiments. For example, the actuator 132 may be a toggle actuator, a rocker actuator, a rotary actuator, a slide actuator, or another type of actuator. The actuator 132 may be toggled between an on state and an off state in various embodiments. In other embodiments, the actuator 132 controls an electrical state of the switch 104. In other embodiments, the actuator 132 controls different circuit functions by rotating. Other types of movements of the actuator are possible in alternative embodiments.

Figure 3:
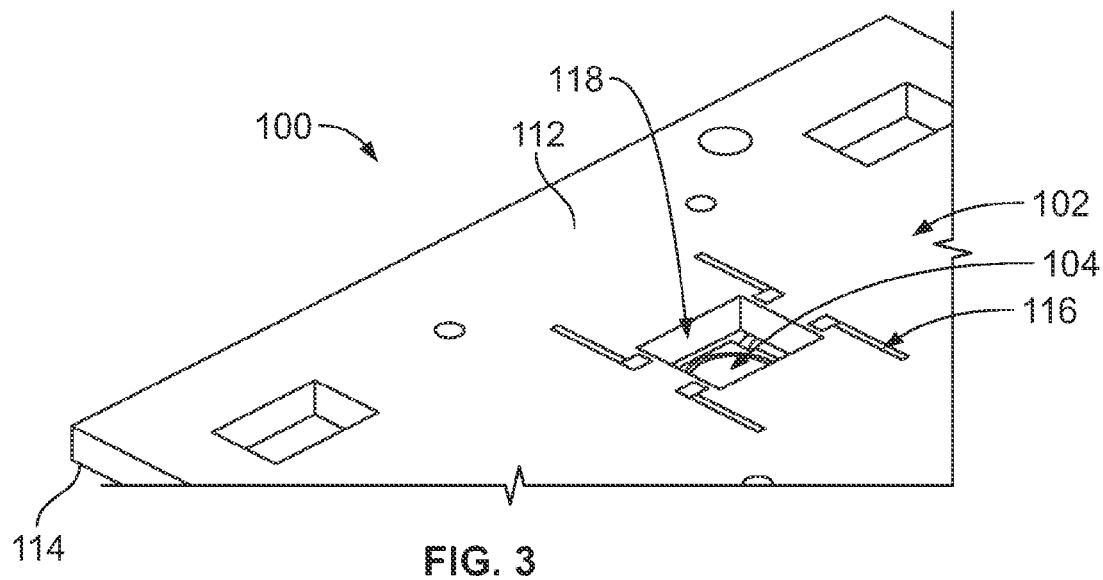
FIG. 3 is a top perspective view of a portion of the electronic device showing one of the switch mechanisms mounted to the substrate in accordance with one embodiment.
Figure 4:
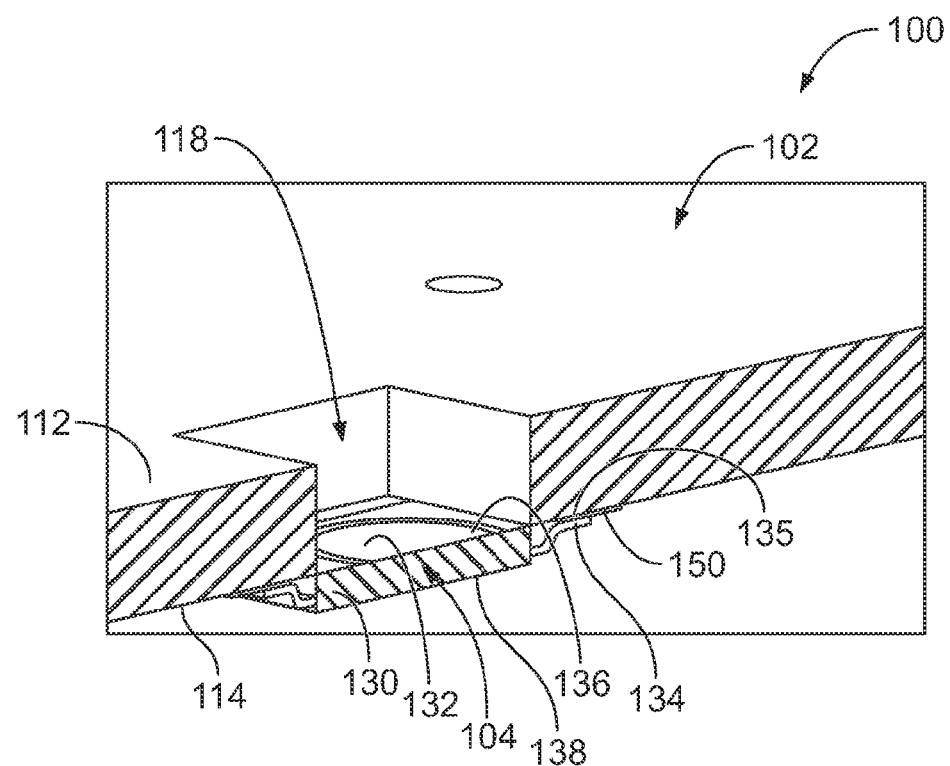
FIG. 4 is cross-sectional view of a portion of the electronic device showing one of the switch mechanisms mounted to the substrate in accordance with one embodiment.

FIG. 3 is a top perspective view of a portion of the electronic device 100 showing one of the switch mechanisms 104 mounted to the circuit board 102. FIG. 4 is cross-sectional view of a portion of the electronic device 100 showing one of the switch mechanisms 104 mounted to the circuit board 102. The openings 118 in the circuit board 102 are illustrated in FIGS. 3 and 4. In an exemplary embodiment, the openings 118 extend entirely through a thickness profile of the circuit board 102 between the top surface 112 and the bottom surface 114. The openings 118 may have any size or shape, such as to receive the switch mechanism 104 and/or the user input actuator 108 (shown in FIG. 1). In the illustrated embodiment, the openings 118 are rectangular in shape; however the openings 118 may have other shapes in alternative embodiments.

In the illustrated embodiment, the switch 104 is recessed relative to the circuit board 102 to reduce the profile or height of the electronic device 100. For example, the bottom 138 of the switch 104 is positioned below the top surface 112. At least a portion of the switch 104 may be within the thickness profile of the circuit board 102. In the illustrated embodiment, the entire housing 130 is positioned below the top surface 112. Optionally, the top 136 of the housing 130 is positioned below the bottom surface 114. The switch 104 is positioned below the opening 118. A portion of the user input actuator 108 (shown in FIG. 1) may be configured to be received in the opening 118 to interface with the actuator 132 of the switch 104.

The mounting pads 135 of the leads 134 are provided along upper surfaces of the leads 134 and face upward. The mounting pads 135 are electrically and mechanically connected to corresponding mounting pads 150 of the circuits 116. The mounting pads 135 are soldered to the mounting pads 150. The mounting pads 135 may be mechanically and electrically connected to the mounting pads 150 by other processes in alternative embodiments. The mounting pads 150 are provided on the bottom surface 114. The mounting pads 150 may be electrically connected to conductors or traces of the circuit 116 on interior layers or on the top surface 112 using conductive vias (not shown) extending through the circuit board 102. Optionally, the switches 104 may be supported from below such that the solder joints between the mounting pads 135, 150 are not over stressed during actuation.

In the illustrated embodiment, the mounting pads 135 of the leads 134 are positioned at or above the top 136 of the housing 130 of the switch 104. For example, the leads 134 may be bent upward to position the mounting pads 135 relative to the top 136 of the housing 130. Other electrical components may be provided below the bottom surface 114 of the circuit board 102. The switch 104 may have a lower profile than such electrical components such that the switches 104 do not increase the profile of height of the electronic device 100. Recessing the switches 104 and providing the switches 104 below the circuit board 102 reduces the protruding height of the switches 104 above the circuit board 102 (in the illustrated embodiment, the switches 104 have zero protruding height above the top surface 112) as compared to conventional electronic devices 100 that surface mount switches 104 to the top surface 112, wherein the entire height or thickness of the switch 104 adds to the protruding height above the top surface of such circuit boards. As such, the electronic device 100 having the switches 104 mounted to the bottom surface 114 and provided below the bottom surface 114 reduces an overall profile or height of the electronic device 100 as compared to conventional electronic devices.

Figure 5:
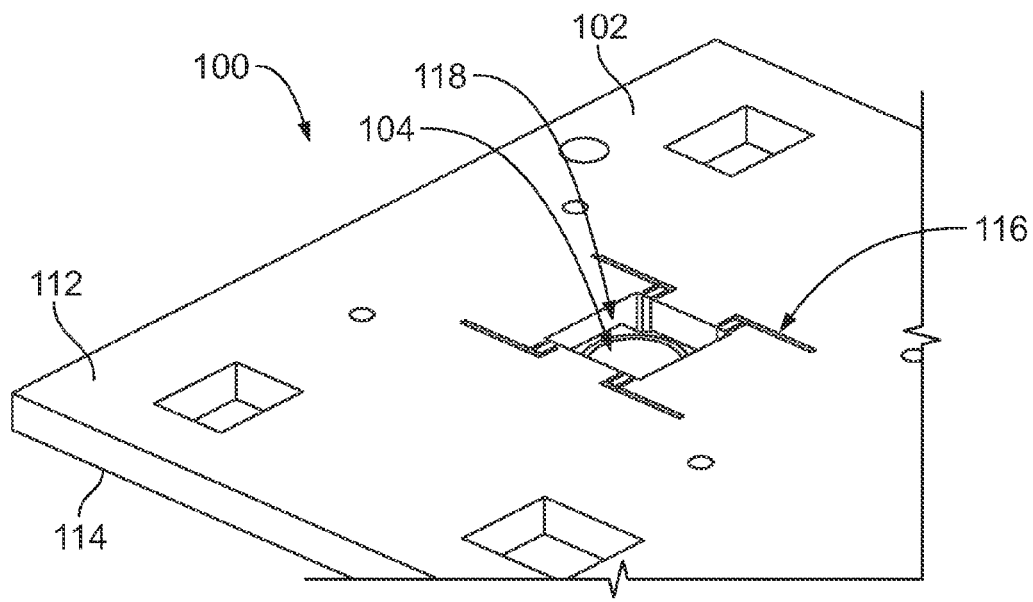
FIG. 5 is a top perspective view of a portion of the electronic device showing one of the switch mechanisms mounted to the substrate in accordance with one embodiment.
Figure 6:
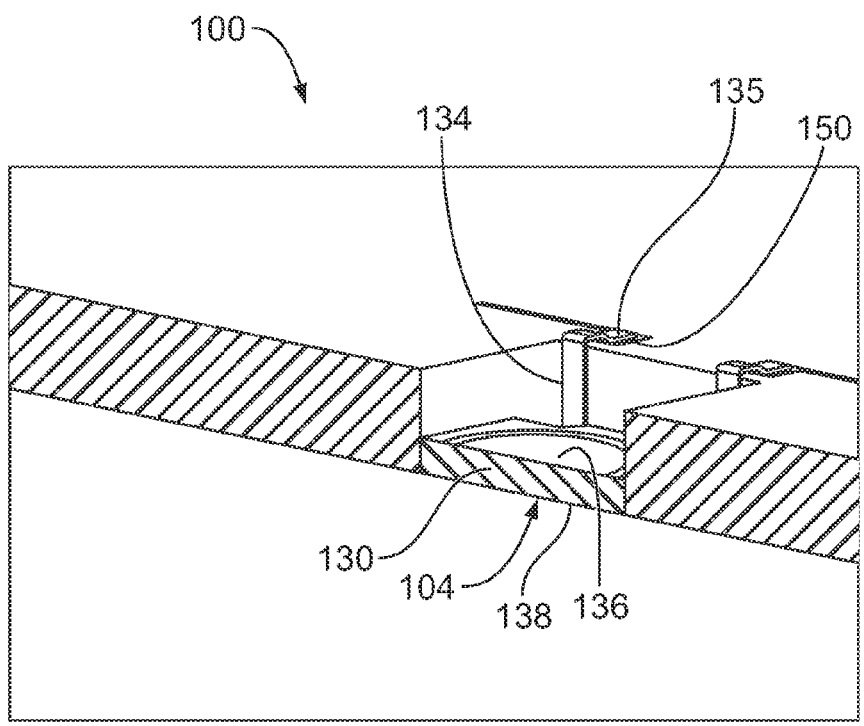
FIG. 6 is a cross-sectional view of a portion of the electronic device showing one of the switch mechanisms mounted to the substrate in accordance with one embodiment.

FIG. 5 is a top perspective view of a portion of the electronic device 100 showing one of the switch mechanisms 104 mounted to the circuit board 102. FIG. 6 is a cross-sectional view of a portion of the electronic device 100 showing one of the switch mechanisms 104 mounted to the circuit board 102. In an exemplary embodiment, the openings 118 extend entirely through a thickness profile of the circuit board 102 and the switches 104 are at least partially received in the openings 118 within the thickness profile. The openings 118 are sized and shaped to receive the switch mechanisms 104.

In the illustrated embodiment, the switch 104 is recessed relative to the circuit board 102 to reduce the profile or height of the electronic device 100. For example, the bottom 138 of the switch 104 is positioned below the top surface 112. At least a portion of the switch 104 may be within the thickness profile of the circuit board 102. In the illustrated embodiment, the entire housing 130 is positioned below the top surface 112 and the bottom 138 of the housing 130 is generally flush with the bottom surface 114; however the bottom 138 may be above the bottom surface 114 or below the bottom surface 114 in alternative embodiments. A portion of the user input actuator 108 (shown in FIG. 1) may be configured to be received in the opening 118 to interface with the actuator 132 of the switch 104.

The leads 134 extend upward from the housing 130 and are configured to be mounted to the mounting pads 150 on the top surface 112. For example, the leads 134 extend through the opening 118, such as along the side walls of the opening, to the top surface 112. The mounting pads 135 of the leads 134 are provided along lower surfaces of the leads 134 and face downward. The mounting pads 135 are electrically and mechanically connected to corresponding mounting pads 150 of the circuits 116. For example, the mounting pads 135 may be soldered to the mounting pads 150. The mounting pads 135 may be mechanically and electrically connected to the mounting pads 150 by other processes in alternative embodiments. Optionally, the switches 104 may be supported from below such that the solder joints between the mounting pads 135, 150 are not over stressed during actuation.

The switches 104 minimally increase the profile of height of the electronic device 100. Recessing the switches 104 and providing the switches 104 within the openings 118 reduces the protruding height of the switches 104 above the circuit board 102 (in the illustrated embodiment, the switches 104 have near-zero protruding height above the top surface 112 as only the leads 134 extend above the top surface 112) as compared to conventional electronic devices 100 that traditionally mount switches 104 to the top surface 112, wherein the entire height or thickness of the switch 104 adds to the protruding height above the top surface of such circuit boards. As such, the electronic device 100 having the switches 104 mounted within the openings 118 and provided below the top surface 112 reduces an overall profile or height of the electronic device 100 as compared to conventional electronic devices.

Figure 7:
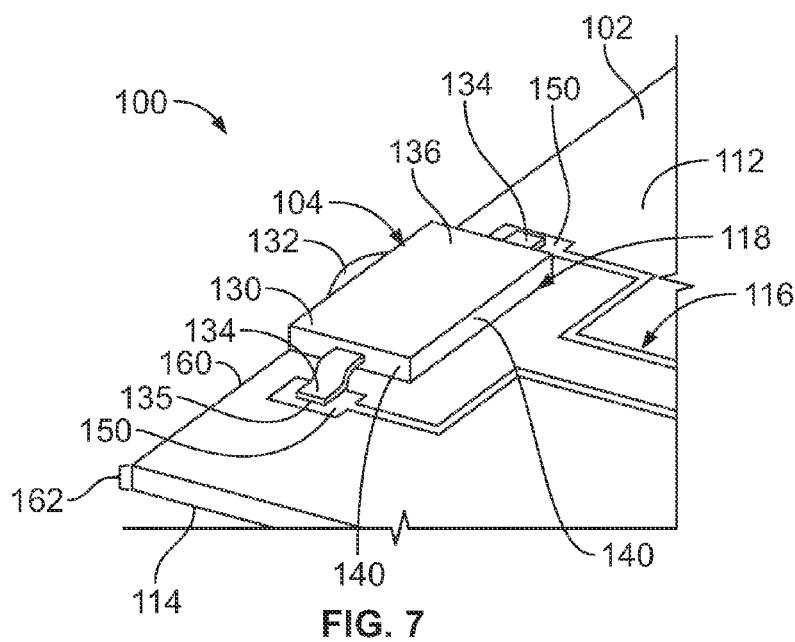
FIG. 7 is a top perspective view of a portion of the electronic device in accordance with one embodiment.
Figure 8:
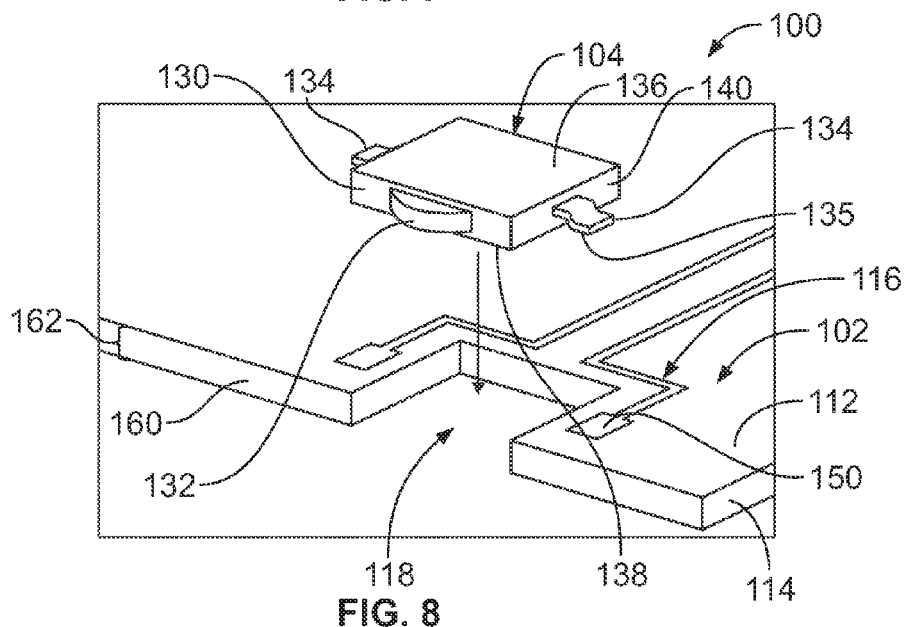
FIG. 8 is an exploded view of a portion of the electronic device in accordance with one embodiment.
Figure 9:
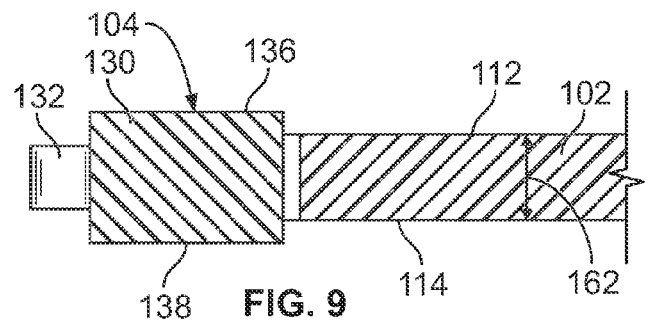
FIG. 9 is a cross-sectional view of a portion of the electronic device in accordance with one embodiment.

FIG. 7 is a top perspective view of a portion of the electronic device 100. FIG. 8 is an exploded view of a portion of the electronic device 100. FIG. 9 is a cross-sectional view of a portion of the electronic device 100. FIGS. 7-9 illustrate the switch 104 having the actuator 132 arranged as a right angle actuator. FIGS. 7-9 illustrate the circuit board 102 having the opening 118 arranged at an edge 160 of the circuit board 102. The opening 118 is open at the edge 160. The actuator 132 is a side-actuated switch partially recessed into the opening 118.

The edge 160 defines a thickness profile 162 of the circuit board 102 between the top surface 112 and the bottom surface 114. The switch 104 is positioned within the thickness profile 162. In an exemplary embodiment, the actuator 132 is positioned within the thickness profile 162 of the circuit board 102. For example, a portion of the housing 130 may be arranged below the top surface 112 and a portion of the housing 130 may be positioned above the bottom surface 114. In the illustrated embodiment, the top 136 of the housing 130 is provided above the top surface 112 and the bottom 138 of the housing 130 is provided below the bottom surface 114. The housing 130 can also be entirely contained within the thickness profile 162 in other various embodiments. The switch 104 extends beyond the thickness profile 162, such as above the thickness profile 162 and below the thickness profile 162. The switch 104 may be positioned differently in alternative embodiments, such as with the top 136 flush with the top surface 112 and/or the bottom 138 flush with the bottom surface 114. In other embodiments, the top 136 may be recessed below the top surface 112 and/or the bottom 138 may be provided above the bottom surface 114. However, the switch 104 is recessed relative to the circuit board 102 such that the bottom 138 is positioned below the top surface 112 of the circuit board 102 to reduce the profile or height of the electronic device 100.

In the illustrate embodiment, the leads 134 extend from the sides 140 such that the mounting pads 135 are mechanically and electrically connected to the mounting pads 150 on the top surface 112 of the circuit board 102. The leads 134 are electrically connected to corresponding circuits 116 of the circuit board 102. In alternative embodiments, the mounting pads 150 of the circuit board 102 may be provided on the bottom surface 114. In other various embodiments, the mounting pads 150 may be recessed below the top surface 112. For example, the circuit board 102 may have a notch out that exposes an interior layer of the circuit board 102 having the mounting pads 150.

The switch 104 is provided at the edge 160 such that the actuator 132 is exposed beyond the edge 160 for actuation. The actuator 132 is positioned below the top surface 112, such as within the thickness profile 162. Having the switch 104 nested within the thickness profile 162 reduces the profile of the switch 104 above the top surface 112 thereby reducing the overall profile of the electronic device 100.

It is to be understood that the above description is intended to be illustrative, and not restrictive. For example, the above-described embodiments (and/or aspects thereof)

may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A switch mechanism configured to be mounted to a substrate having a top surface, a bottom surface and at least one opening therethrough and having a circuit with mounting pads on the bottom surface, the switch mechanism comprising
    an actuator configured to activate the switch mechanism, the actuator being aligned with the opening and being accessible through the opening from above the top surface of the circuit board;
    a housing holding the actuator, the housing having a top and a bottom and sides extending between the top and the bottom, the actuator being actuated from above the top of the housing, wherein a portion of the housing is located in the opening such that the top of the housing is positioned above the bottom surface of the substrate; and
    leads extending from the housing and remaining at or below the top of the housing, the leads having mounting pads extending from the housing, the mounting pads having generally planar mounting surfaces that are upward facing and being configured to be electrically connected to the circuit at the mounting pads on the bottom surface of the substrate;
    wherein the leads extend from the housing such that the mounting pads are elevated above the bottom of the housing to allow at least a portion of the housing to be positioned below the top surface of the substrate.

2. The switch mechanism of claim 1, wherein the mounting pads face upward and are configured to be mounted to the bottom surface of the substrate.

3. An electronic device comprising:
    a substrate having a top surface, a bottom surface and an opening therethrough, the substrate having a circuit on the top surface; and
    a switch mechanism mounted to the substrate below the opening and electrically connected to the circuit, the switch mechanism having an actuator aligned with the opening configured to activate the switch mechanism, the switch mechanism having a housing holding the actuator and leads extending from the housing, the leads being bent and formed to extend unobstructed through the opening above the actuator with each of the leads being in the same opening, the leads having mounting pads flared outward and defining mounting surfaces that are downward facing and being electrically connected to the circuit on the top surface of the substrate, the switch mechanism being mounted to the substrate in the opening such that at least a portion of the housing is positioned below the top surface.

4. The electronic device of claim 3, wherein the entire housing is positioned below the top surface.

5. The electronic device of claim 3, wherein the actuator is positioned below the top surface.

6. The electronic device of claim 3, wherein the housing has a top and a bottom, the bottom of the housing is positioned below the top surface.

7. The electronic device of claim 6, wherein the top of the housing is positioned below the bottom surface of the substrate.

8. The electronic device of claim 3, wherein the leads are mounted to corresponding mounting pads of the circuits on the top surface of the substrate.

9. The electronic device of claim 3, wherein the leads are mounted to corresponding mounting pads of the circuits on the bottom side of the substrate.

10. The electronic device of claim 3, wherein the leads have mounting pads mounted to corresponding mounting pads of the circuits, the mounting pads of the leads being positioned above a bottom of the housing of the switch mechanism.

11. The electronic device of claim 10, wherein the mounting pads of the leads are positioned at or above a top of the housing of the switch mechanism.

12. The electronic device of claim 3, wherein the opening is provided at an edge of the substrate, the edge defining a thickness profile of the substrate between the top surface and the bottom surface, the actuator being positioned within the thickness profile of the substrate.

13. The electronic device of claim 12, wherein the actuator extends outward beyond the edge.

14. The electronic device of claim 3, further comprising a user input above the top surface of the substrate, the user input having a user input actuator engaging and actuating the actuator of the switch mechanism.

15. The electronic device of claim 14, wherein the user input is a key pad and the user input actuator is a key.

16. The electronic device of claim 3, wherein the actuator is a tactile button.

17. The electronic device of claim 3, wherein the actuator is at least one of a toggle actuator, a rocker actuator, a rotary actuator, and a slide actuator.

18. The switch mechanism of claim 1, wherein the bottom of the housing is located at or below the bottom surface of the substrate.

* * * * *